United States Patent
Stolze et al.

(10) Patent No.: US 8,563,364 B2
(45) Date of Patent: Oct. 22, 2013

(54) METHOD FOR PRODUCING A POWER SEMICONDUCTOR ARRANGEMENT

(75) Inventors: Thilo Stolze, Arnsberg (DE); Guido Strotmann, Anröchte (DE); Karsten Guth, Soest (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/248,311

(22) Filed: Sep. 29, 2011

(65) Prior Publication Data

US 2013/0084679 A1    Apr. 4, 2013

(51) Int. Cl.
*H01L 21/60*    (2006.01)

(52) U.S. Cl.
USPC .......................................... 438/121; 438/106

(58) Field of Classification Search
USPC .................................. 438/121; 257/735, 177
See application file for complete search history.

(56) References Cited

U.S. PATENT DOCUMENTS

| | | | |
|---|---|---|---|
| 6,483,128 B2 | 11/2002 | Loddenkotter et al. | |
| 6,858,807 B2 | 2/2005 | Ferber et al. | |
| 7,656,672 B2 | 2/2010 | Schilling et al. | |
| 7,955,356 B2 | 6/2011 | Zucherman et al. | |
| 2001/0025964 A1 | 10/2001 | Loddenkotter et al. | |
| 2008/0230905 A1* | 9/2008 | Guth et al. | 257/751 |
| 2009/0140399 A1* | 6/2009 | Schulz et al. | 257/660 |
| 2010/0127400 A1 | 5/2010 | Kanschat et al. | |
| 2011/0053319 A1* | 3/2011 | Hohlfeld et al. | 438/121 |
| 2011/0075451 A1* | 3/2011 | Bayerer et al. | 363/37 |
| 2011/0121448 A1* | 5/2011 | Tsukada et al. | 257/735 |

FOREIGN PATENT DOCUMENTS

| | | |
|---|---|---|
| DE | 100 26 743 C1 | 1/2002 |
| DE | 103 43 821 A1 | 4/2005 |
| DE | 103 52 671 A1 | 6/2005 |
| DE | 10 2004 052 039 A1 | 5/2006 |
| DE | 100 08 572 B4 | 8/2007 |
| DE | 10 2008 058 003 A1 | 5/2010 |

OTHER PUBLICATIONS

Bayerer, R. et al. "Higher Junction Temperature in Power Modules—a demand from hybrid cars, a potential for the next step increase in power density for various Variable Speed Drives", Power Conversion Intelligent Motion, May 27, 2008, Nuremberg, Germany.
Stolze, T. et al. "Reliability of PressFIT Connections", Power Conversion Intelligent Motion, May 27-29, 2008, Nuremberg, Germany.
Bayerer, R. et al. "Higher Junction Temperature in Power Modules - a demand from hybrid cars, a potential for the next step increase in power density for various Variable Speed Drives", Power Conversion Intelligent Motion, May 27, 2008, Nuremberg, Germany.

* cited by examiner

*Primary Examiner* — Telly Green
*Assistant Examiner* — Damian A Hillman
(74) *Attorney, Agent, or Firm* — Murphy, Bilak & Homiller, PLLC

(57) ABSTRACT

In a method for producing a power semiconductor arrangement, a dielectric insulation carrier with a top side and a top metallization layer arranged on the top side are provided. Also provided are a semiconductor chip and at least one electrically conductive contact pin, each pin having a first end and an opposite second end. The semiconductor chip is sintered or diffussion soldered to the top metallization layer. Between the first end and the top metallization layer an electrically conductive connection is formed, in which electrically conductive connection material of the contact pin is in direct physical contact with the material of the top metallization layer.

25 Claims, 6 Drawing Sheets

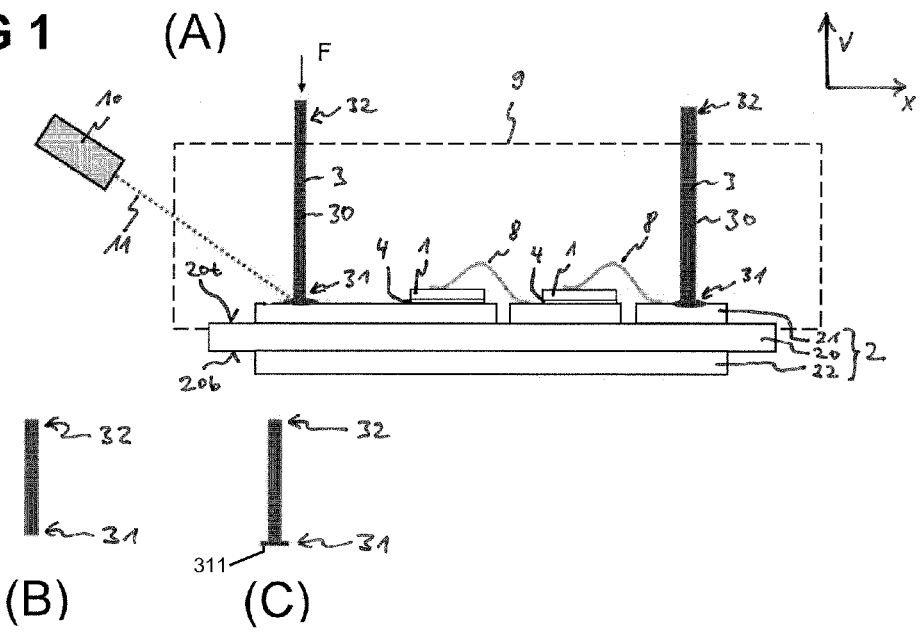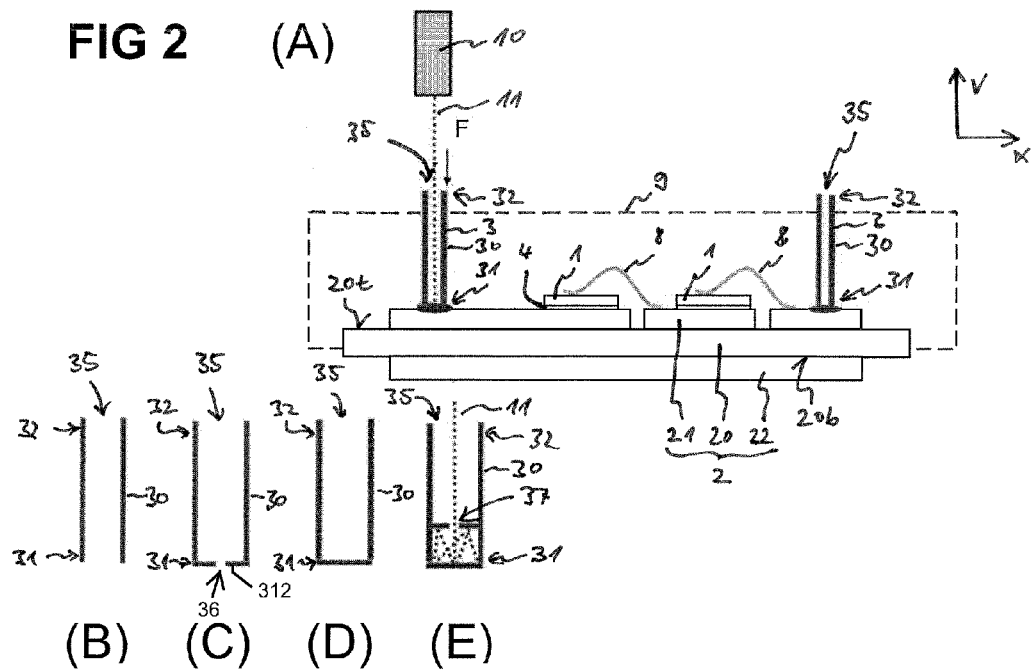

(B) (C) (D) (E)

(A)   (B)   (C)   (D)   (E)

METHOD FOR PRODUCING A POWER SEMICONDUCTOR ARRANGEMENT

TECHNICAL FIELD

The invention relates to a method for producing a power semiconductor arrangement.

BACKGROUND

In many power semiconductor arrangements, the internal and external electrical connection of the arrangement is realized using electrically conductive contact pins. However, electrically connecting such contact pins to a circuit carrier of the arrangement is cumbersome and often requires manual work. In the production of a power semiconductor module package, package cost is a key figure for commercial success. Interconnects from inside the module to a PCB (printed circuit board) outside the module play an important role concerning this cost. Therefore, the "pin-rivet" process as is for instance described in U.S. Pat. No. 6,483,128 B2, which allows to place pins anywhere on the substrate in an automated way, is presently essential for such packages. In the conventional production process, at least one semiconductor chip and at least one rivet are picked and placed onto a solder paste that is applied onto the metallization of a substrate. Subsequently, the at least one semiconductor chip and the at least one rivet are soldered to the metallization in a common soldering step in which the solder is first melted and then cooled down below its melting point. Afterward, pins are inserted into the soldered rivets. However, new connection techniques like sintering or diffusion soldering are valuable for joining semiconductor chips to the metallization of a substrate but are not attractive for joining rivets to the metallization of a substrate as the rivets could be crushed due the high pressures required for sintering and as diffusion soldering is usually a paste-less process. To continue with the known rivets would require to selectively dispense a soldering paste after chip assembly and a second solder-furnace step which is considered to become too expensive. Therefore, there is a need for an improved method for producing a power semiconductor arrangement

SUMMARY

According to one embodiment of a method for producing a power semiconductor arrangement, a dielectric insulation carrier with a plane top side and with a top side metallization layer arranged on the plane top side are provided. Also provided are at least one semiconductor chip and a number of $N \geq 1$ electrically conductive contact pins each comprising a first end and an opposite second end.

The semiconductor chip and the top metallization layer are joined by a connection layer that is arranged between the semiconductor chip and the top metallization layer, wherein the connection layer is produced by diffusion soldering or by sintering. For each of the contact pins, between the first end of the contact pin and the top metallization layer an electrically conductive connection is formed, in which electrically conductive connection material of the contact pin is in direct physical contact with the material of the metallization layer.

According to a further embodiment of a method for producing a power semiconductor arrangement, a number of contact pins are subsequently connected to a top metallization of a circuit carrier. That method includes:

(a) providing a semiconductor chip;
(b) joining the semiconductor chip and the top metallization layer by a connection layer arranged between the semiconductor chip and the top metallization layer, wherein the connection layer is produced by diffusion soldering or by sintering;
(c) providing a dielectric insulation carrier with a top side and a top metallization layer arranged on the top side;
(d) providing a contact pin reservoir capable of providing a number of contact pins, each of the contact pins having a first end and an opposite second end; and
(e) forming, for each of a number of contact pins of the contact pin reservoir, an electrically conductive connection between the top metallization layer and the first end of the respective contact pin, in which electrically conductive connection material of the contact pin is in direct physical contact with the material of the top metallization layer.

In the methods according to the present invention, the order of the single method steps is arbitrary unless noted otherwise or unless a certain method step requires that another method step is carried out prior to the certain method step.

Those skilled in the art will recognize additional features and advantages upon reading the following detailed description, and upon viewing the accompanying drawings.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts.

FIG. 1(A) illustrates a contact pin that is beam welded to a metallization of a circuit carrier.

FIG. 1(B) illustrates a side view of a contact pin having a straight first end.

FIG. 1(C) illustrates a side view of a contact pin having a first end that is formed as a flange.

FIG. 2(A) illustrates a contact pin having a hollow shaft, and a first end that is beam welded to a metallization of a circuit carrier, wherein the beam runs through the hollow shaft.

FIG. 2(B) illustrates a contact pin having a hollow shaft and a straight first end.

FIG. 2(C) illustrates a contact pin having a hollow shaft and an interior flange at its first end.

FIG. 2(D) illustrates a contact pin having a hollow shaft that is closed at the first end.

FIG. 2(E) illustrates a contact pin having a hollow shaft with an integrated pin hole spaced distant from the first end.

DETAILED DESCRIPTION

Figure 3:
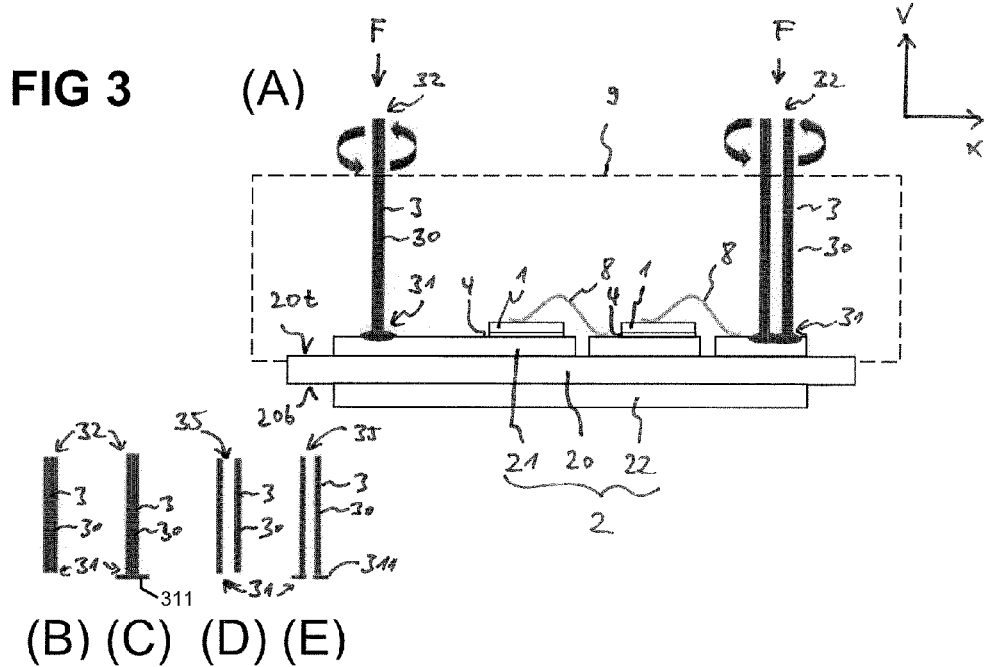
FIG. 3(A) illustrates how contact pins are spin welded to a metallization of a circuit carrier.
FIG. 3(B) illustrates a contact pin having a straight first end.
FIG. 3(C) illustrates a contact pin having a first end that is formed as a flange.
FIG. 3(D) illustrates a contact pin having a hollow shaft and a straight first end.
FIG. 3(E) illustrates a contact pin having a hollow shaft and a first end that is formed as a flange.

In the following Detailed Description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the Figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Referring now to FIG. 1(A) there is illustrated an intermediate step of the production of a power semiconductor module in which step a contact pin 3 is mounted to a circuit carrier 2. In a subsequent step, the circuit carrier 2 is mounted in a module housing 9 which in FIG. 1(A) is illustrated in dashed fashion so as to express that the module housing 9 is not necessarily mounted during the step of welding.

The circuit carrier 2 includes an insulation carrier 20 with a plane top side 20t and a bottom side 20b, a plane top metallization 21 attached to the top side 20t and an optional bottom metallization 22 attached to the bottom side 20t. The direction of the surface normal of the top side 20t is referred to as vertical direction v. The top metallization 21 is structured so as to include electrically conductive lines and/or conductive areas. The optional bottom metallization 22 is formed as a continuous, uninterrupted metal layer. Alternatively, the optional bottom metallization 22 may also be structured so as to include electrically conductive lines and/or conductive areas.

At least one power semiconductor chip 1, for instance a MOSFET (metal oxide semicondcutor field effect transistor), an IGBT (insulated gate bipolar transistor), a JFET (junction field effect transistor), a thyristor, a diode or in principle any other kind of semiconductor chip is mounted to the top metallization 21 using a connection layer 4. For example, the connection layer 4 may be a solder layer, a diffusion solder layer, a sintered layer, an electrically conductive or electrically insulating adherant. The connection layer 4 is used to mechanically joint the power semiconductor chip 1 with the top metallization 21 and may optionally be also used to electrically connect the power semiconductor chip 1 to the top metallization 21.

Optionally, the top side of the power semiconductor chip 1, that is, the side facing away from the circuit carrier 2, may be electrically connected FIG. 1(A) to 1(C) further show that the contact pin 3 has a first end 31, and a second end 32 opposite the first end 31. The contact pin 3 may be made of one piece or alternatively be composed of two or more pieces. For instance, the contact pin 3 may be made of metal, e.g. of copper, of aluminum, of a copper-based alloy or of an aluminum-based alloy like CuSn6, CuFe2P or CuZr.

In order to allow for the contact pin 3 to serve as an external electrical connector of the power semiconductor arrangement, the contact pin 3 may later protrude the housing 9 so that the second end 32 is accessible from the exterior of the housing 9. In FIG. 1(A) however, the housing 9 is not yet attached to the circuit carrier 2 as this will take place only after the mounting of the contact pin 3 on the circuit carrier 2 is completed.

In order to electrically and mechanically connect the first end 31 to the top metallization 21, a beam welding method may be used. To this, FIG. 1(A) illustrates a beam source 10 which provides a welding beam 11, for instance a laser beam or an electron beam. The welding beam 11 is directed to the border area between the first end 31 and the top metallization 21 so as to produce a welded connection between the first end 31 and the top metallization 21. During the welding process, the contact pin 3 may be pressed toward the top metallization 21 by a force F.

As is further illustrated in FIGS. 1(B) and 1(C), the first end 31 of the contact pin 3 may be formed as a straight end or as to have a flange 311. Such a flange 311 serves to increase the contact area between the contact pin 3 and the top metallization 21. Due to the flange 311, the circumference of the first end 31 is increased compared with the circumference of the first end 31 of a contact pin 3 having a straight first end 31 as illustrated in FIG. 1(B). Accordingly, a flange 311 helps to increase the mechanical stability of the welded connection.

A further embodiment of a method for beam welding is illustrated in FIG. 2(A). In this embodiment, the contact pins 3 have a hollow shaft 30 and an opening 35 at its second end 32. The opening 35 and the hollow shaft 30 allow the welding beam 11 to enter the opening 35 and to run through the hollow shaft 30 as far as the first end 31 where the welding takes place. In this process, the direction of the welding beam 11 may be perpendicular to the top surface of the top metallization layer 21. The advantage of this welding method is that there is no welding cinder spattering around.

In order to allow for such a beam welding method, the contact pin 3 may have a hollow shaft 30 and an opening 35 at the second end 32. FIGS. 2(B) to 2(E) show some embodiments of suitably formed contact pins 3.

The contact pin 3 of FIG. 2(B) is a straight pin having a straight hollow shaft 30 and straigth first and second ends 31 and 32, respectively. The contact pin 3 of FIG. 2(C) differs from the contact pin 3 of FIG. 2(B) only in that the first end 31 has an interior flange 312 at its first end 31. Due to the interior flange 312, the first end 31 is closed except for a pin hole 36. The contact pin 3 of FIG. 2(D) differs from the contact pins 3 of FIGS. 2(B) and 2(C) in that the first end 31 is completely closed.

According to a further embodiment illustrated in FIG. 2(E), the hollow shaft 30 may include a pin hole 37 that is spaced distant from both the first and second ends 31, 32 and which defines a narrow passage inside the hollow shaft 30. Due to the pin hole 37, between the pin hole 37 and the first end 31 a beam trap is formed. The beam trap keeps the energy provided by the welding beam 11 inside the trap and close to the first end 31 which helps to speed up the welding process. Such a beam trap formed by the use of a pin hole 37 that is spaced distant from the first end 31 may be realized in combination with any hollow contact pin 3 that can be beam welded in that the welding beam 11 enters an opening 35 at the second end 32 and runs through the hollow shaft 30 as far as the first end 31. In particular, such a beam trap may be realized in combination with any of the contact pins 3 illustrated in FIGS. 2(B) to 2(D).

A further method for forming a direct physical connection between the material of a contact pin 3 and the material of the top metallization 21 of the circuit carrier 2 is illustrated in FIG. 3(A). In this method, the contact pins 3 are spin welded with their respective first ends 31 to the top metallization 21. To this, the respective contact pin 3 is pressed with its first end 31 by a force F against the top metallization 21 and simultaneously rotated around an axis that runs substantially perpendicular to the top side 20*t*. Thereby, frictional heat is generated due to which at least one of the materials of the contact pin 3 and the top metallization 21 is melted. After the subsequent solidification, a welded connection between the contact pin 3 and the top metallization 21 exists.

Spin welding may take place with any stiff contact pin 3. Some examples of suitable contact pins are illustrated in FIGS. 3(B) to 3(E). The contact pin 3 of FIG. 3(B) is a voidless solid pin having a straight first end 31 and, optionally, a straight second end 32. The contact pin 3 of FIG. 3(C) is also a voidless solid pin that has a flange 311 at its first end 31 and, optionally, a straight second end 32. The contact pin 3 of FIG. 3(D) is formed as a straight pipe having a straight hollow shaft 30 and straight first and second ends 31, 32. The contact pin 3 of FIG. 3(E) differs from the contact pin 3 of FIG. 3(D) in that the first end has a flange 311.

Figure 4:
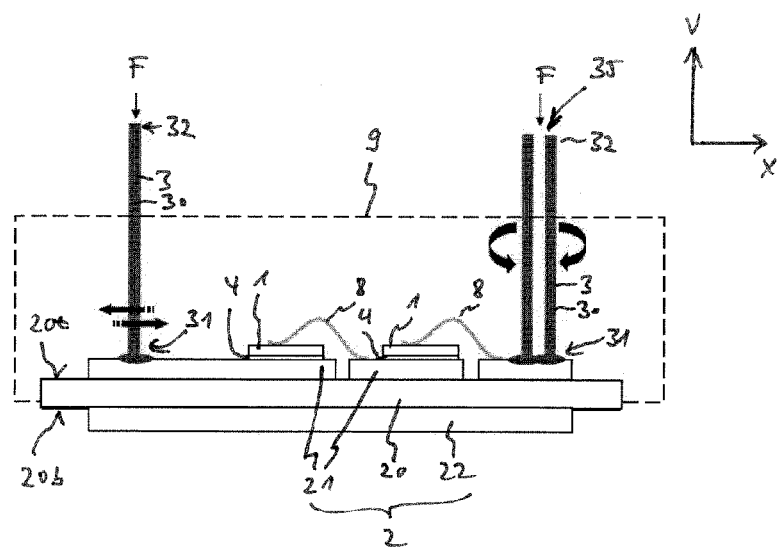
FIG. 4 illustrates a process in which contact pins are linear and torsional ultrasonic friction welded to a metallization of a circuit carrier.

A still further method for forming a direct physical connection between the material of a contact pin 3 and the material of the top metallization 21 of the circuit carrier 2 is illustrated in FIG. 4. In this method, the contact pins 3 are linear or torsional ultrasonic welded with their respective first ends 31 to the top metallization 21.

For linear ultrasonic welding which in FIG. 4 is illustrated for the left contact pin 3, the contact pin 3 is pressed with its first end 31 by a force F against the top metallization 21. Simultaneously, the first end 31 is linearly vibrated at an ultrasonic frequency in a direction x that runs substantially perpendicular to a vertical direction v. For torsional ultrasonic welding which in FIG. 4 is illustrated for the right contact pin 3, the contact pin 3 is pressed with its first end 31 by a force F against the top metallization 21. Simultaneously, the contact pin 3 is rotated around an axis that runs substantially perpendicular to the top side 20*t*, wherein the direction of the rotation alters at an ultrasonic frequency.

In both linear and torsional ultrasonic welding, frictional heat is generated due to which at least one of the materials of the contact pin 3 and the top metallization 21 is melted. After the subsequent solidification, a welded connection between the contact pin 3 and the top metallization 21 exists. Linear or torsional ultrasonic welding may take place with any stiff contact pin 3. Some examples of suitable contact pins were already explained with reference to FIGS. 2(B) to 2(E) and 3(B) to 3(E).

Figure 5:
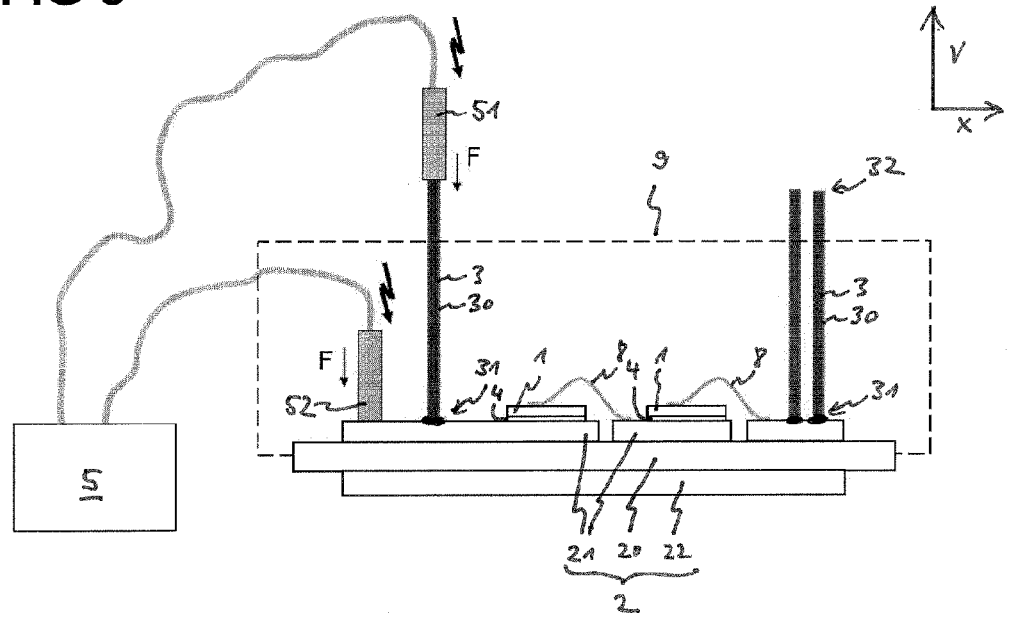
FIG. 5 illustrates a process in which a contact pin is resistance welded to a metallization of a circuit carrier.

According to yet another method for forming a direct physical connection between the material of a contact pin 3 and the material of the top metallization 21 of the circuit carrier 2, resistance welding may be used. As illustrated in FIG. 5, an electric current source 5 having a first electrode 51 and a second electrode 52 is provided. The first electrode 51 is directly connected to the contact pin 3, the second electrode 52 is directly connected to the top metallization 21. Both connections may be established prior to or after the first end 31 of the contact is brought in electrical contact with that section of the top metallization to which the second electrode 52 is connected. As soon as an electrical connection between the first electrode 51 and the second electrode 52 exists, an electric current passes through the contact location between the first end 31 and the top metallization 21. Because of the electrical resistance of the respective contact and the accompanying power loss, heat is generated due to which at least one of the materials of the contact pin 3 and the top metallization 21 is melted. After the subsequent solidification, a welded connection between the contact pin 3 and the top metallization 21 exists. Resistance welding may take place with any electrically conductive contact pin 3. Some examples of suitable contact pins were already explained with reference to FIGS. 2(B) to 2(E) and 3(B) to 3(E). However, any other electrically conductive contact pin 3 is suitable as well.

Figure 6:
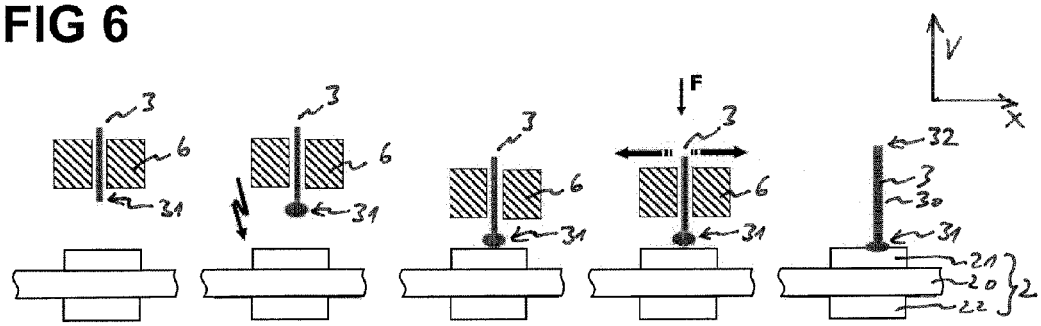
FIGS. 6(A) to 6(E) illustrate different steps of a ball bonding process in which the first end of a contact pin is ball bonded to a metallization of a circuit carrier.

FIGS. 6(A) to 6(E) illustrate different steps of a ball bonding process in which the first end 31 of a contact pin 3 is bonded to a top metallization 21 of a circuit carrier 2. In FIG. 6(A), a contact pin 3 having a straight first end 31 is held with a capillary 6. Then, as illustrated in FIG. 6(B), a high-voltage electric charge is applied to the contact pin 3 via the capillary 6 so as to melt the first end 31 of the pin 3. Thereby, the first end 31 of the contact pin 3 forms into a ball. Then, as shown in FIG. 6(C), the first end 31 is lowered to the top metallization 21, which may optionally be heated to a temperature of at least 125° C. Then, the first end 31 is pressed on the top metallization 21 by a force F. Simultaneously, a linear ultrasonic vibration in the lateral direction x is applied to the first end 31 as shown in FIG. 6(D). The combination of heat, pressure and ultrasonic energy creates a weld between the ball and the top metallization 21. Next, the contact pin 3 is passed out through the capillary 6.

Figure 7:
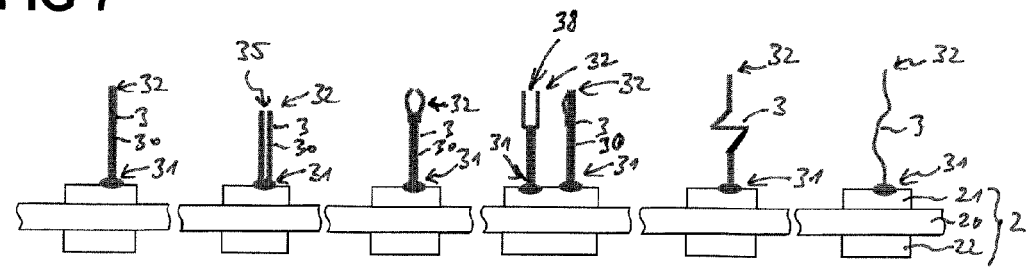
FIG. 7(A) illustrates a contact pin having a first end and a straight second end, the first end being ball bonded to a metallization of a circuit carrier.
FIG. 7(B) illustrates a contact pin having a first end, a straight second end, and a hollow shaft.
FIG. 7(C) illustrates a contact pin having a first end that is ball bonded to a metallization of a circuit carrier, and a forked second end.
FIG. 7(D) illustrates contact pins having a first end that is ball bonded to a metallization of a circuit carrier, and a second end that is formed as a female or male press-fit connector.
FIG. 7(E) illustrates a contact pin having a first end that is ball bonded to a metallization of a circuit carrier, and a shaft that is formed as a mechanical compensating element.
FIG. 7(F) illustrates a contact pin that is formed as a flexible wire having a first end that is ball bonded to a metallization of a circuit carrier.

FIGS. 7(A) to 7(F) illustrate different contact pins 3 the first ends 31 of which are ball bonded to the top metallization 21 of a circuit carrier 2. In FIG. 7(A), the first end 31 of the pin 3 is a solid beam without voids and has a straight second end 32. The contact pin 3 of FIG. 7(B) also has a straight second end 32 but a hollow shaft 30. The contact pin 3 illustrated in FIG. 7(C) is a solid beam without voids and has a forked second end 32. The contact pins 3 of FIG. 7(D) have second ends 32 that are formed as a female press-fit connector (left contact pin 3) or as a male press-fit connector (right contact pin 3). The female press-fit connector 3 on the left has an opening 38 for receiving a corresponding male connector. FIG. 7(E) illustrates a contact pin 3 having a straight second end 32 and a shaft that is formed as a mechanical compensating element which may serve as an expansion bend. Finally, FIG. 7(F) illustrates a contact pin 3 that is formed as a flexible wire.

The contact pins 3 in the embodiments described above are provided as single contact pins 3. However, in order to automatize the production process, a number of contact pins 3 may be subsequently connected to the top metallization 21 of a circuit carrier 2 as will now be explained with reference to FIG. 8. In this method, a dielectric insulation carrier 20 with a top side 20t and with a top metallization layer 21 arranged on the top side 20t is provided. Also provided is a contact pin reservoir 12 or 13 that is capable of providing a number of contact pins 3.

Figure 8:
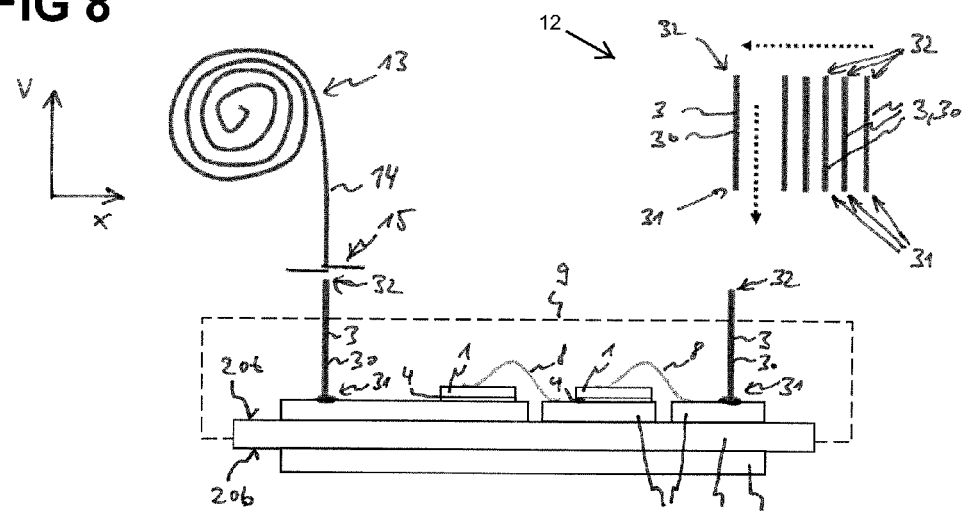
FIG. 8 illustrates a process in which contact pins are unrolled from a reeled contact pin wire or taken out of a magazine.

According to a first embodiment of a contact pin reservoir 12 illustrated on the right side of FIG. 8, a magazine 12 equipped with a number of contact pins 3 is provided. Each of the contact pins 3 has a first end 31 and an opposite second end 32. For each of the number of contact pins 3 of the contact pin magazine 12, an electrically conductive connection between the top metallization layer 21 and the first end 31 of the respective contact pin 3 is produced in such a manner, that the material of the contact pin 3 is in direct physical contact with the material of the top metallization layer 21. To this, one or more of the connection techniques described above with reference FIGS. 1(A) to 7 may be used.

According to a second embodiment of a contact pin reservoir illustrated on the left side of FIG. 8, the contact pin reservoir 13 may be a rolled-up continuous contact pin wire 14 which therefore can be provided in form of a roll. The contact pin wire 14 has a first end 31. Electrically conductive connections between the first ends 31 of a number of contact pins 3 and the top metallization 21 may be formed by first forming an electrically conductive welded or ball bonded connection between the first end 31 of the contact pin wire 14 and the top metallization 21. Before or subsequently, a piece of the contact pin wire 14 may be cut off using a cutting tool 15 so as to achieve a new first end 31 of the contact pin wire 14. Then, between the new first end 31 and the top metallization 21 an electrically conductive welded or ball bonded connection may be formed and so on.

Figure 9:
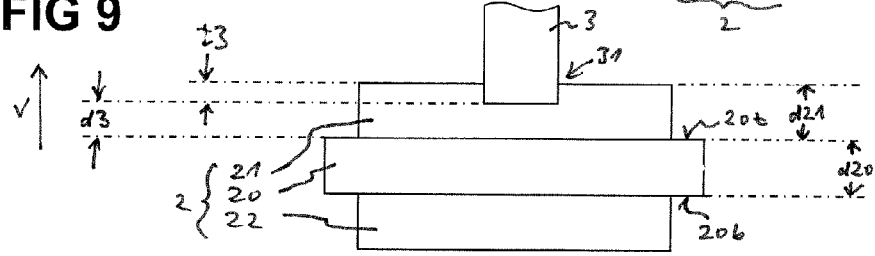
FIG. 9 illustrates the maximum submersion depth of a contact pin in a top metallization of a circuit carrier.

FIG. 9 illustrates that after completing the formation of the connection between the first end 32 of a contact pin 3 and a top metallization 21, the contact pin 3 may be slightly submerged in the top metallization 21. In FIG. 9, t3 indicates the submersion depth of the contact pin 3 in the top metallization 21. For instance, the submersion depth t3 which is the difference between the thickness d21 of the top metallization 21 and the distance d3 between the contact pin 3 and the top side 20t of the dielectric insulation carrier 20, may be less than 0.1 mm.

Figure 10:
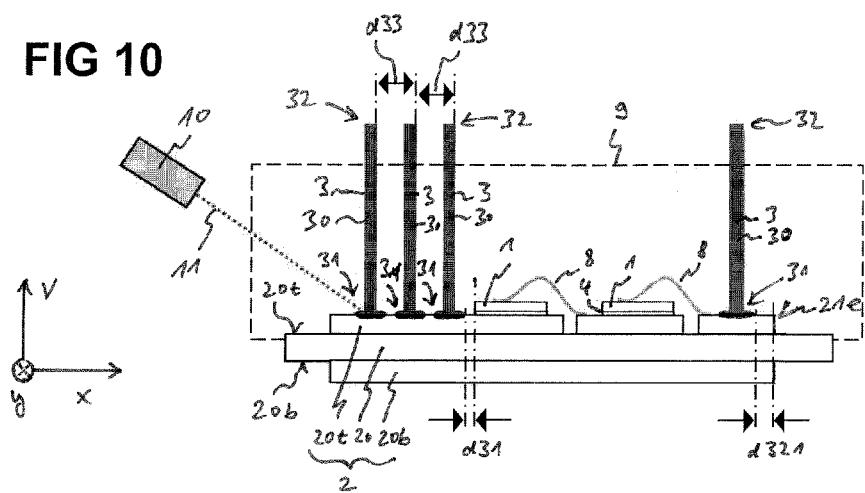
FIG. 10 illustrates a number of contact pins that are welded to the top metallization layer of a circuit carrier.
Figure 11:
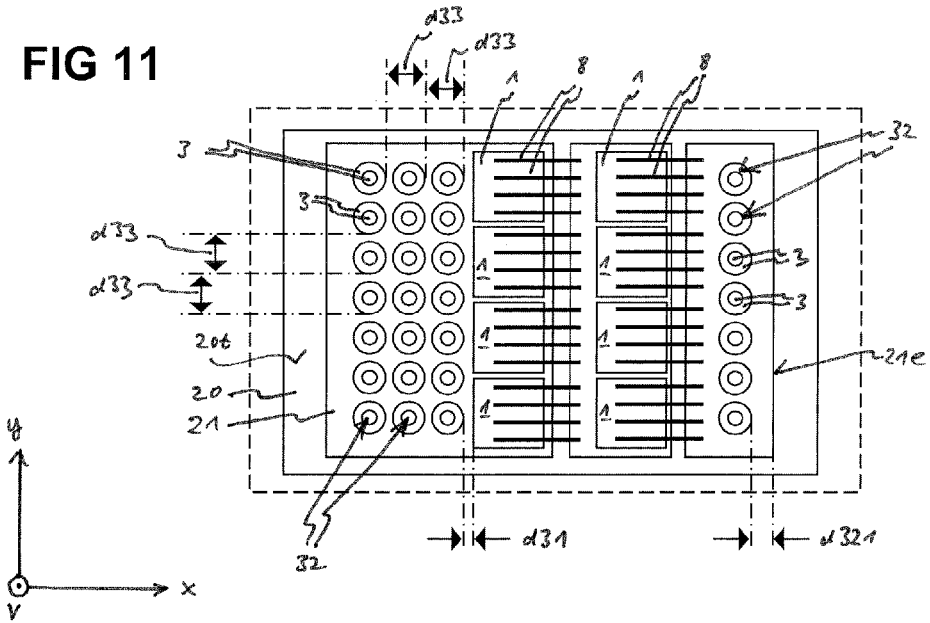
FIG. 11 is a top view of the arrangement of FIG. 10.

FIG. 10 illustrates a semiconductor module in which a number of contact pins 3 are subsequently welded to the top metallization layer 21 of a circuit carrier 2. FIG. 11 is a top view of the arrangement of FIG. 10. The welded contact pins 3 may have, optionally in different lateral directions x, y, a repeat distance d33 of less than or equal to 0.7 mm. Further, at least one of the contact pins 3 may be spaced distant from a semiconductor chip 1 at a distance d31 of less than or equal to 0.7 mm. Moreover, at least one of the contact pins 3 may be spaced distant from a lateral edge 21e of the top metallization layer 21 at a distance d321 of less than or equal to 0.7 mm. The lateral edge 21e of the top metallization layer 21 is an edge at the top side of the top metallization layer 21 in a direction perpendicular to the vertical direction v. Due to the used welding technology, a large number of contact pins 3 can be mounted to the top metallization layer 21. For instance, the number of contact pins 3 welded to the top side metallization layer 21 may be at least ten.

Figure 12:
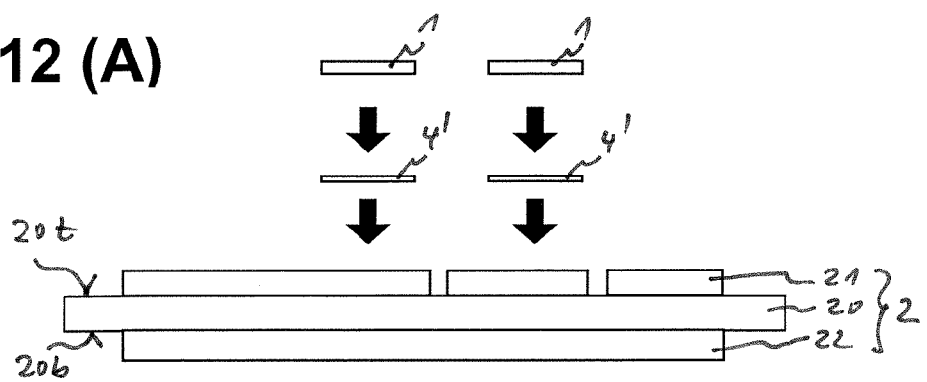
FIGS. 12(A) and 12(B) illustrate different steps of forming a sintered or diffusion soldered joint between a semiconductor chip and a top metallization layer.
Figure 12:
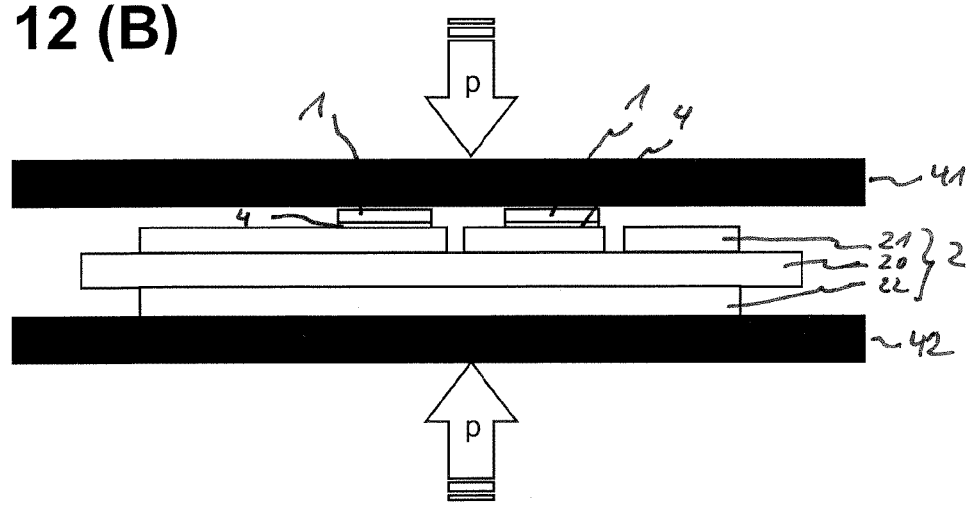

FIGS. 12(A) and (B) illustrate different steps of forming a sintered or diffusion soldered joint between a semiconductor chip 1 and a top metallization layer 21 of a substrate 2. According to FIG. 12(A), between each semiconductor chip 1 and the top metallization layer 21 a connection material 4' is arranged.

In case of a diffusion soldered joint to be formed between the semiconductor chips 1 and the top metallization 21, the connection material 4' may be a pre-form solder, for instance a solder that includes tin, and the top metallization layer 21 may be, for instance, a copper layer. According to FIG. 12(B), the semiconductor chips 1 are pressed against the top metallization 21 such that the respective pressure p inter alia acts on the connection material 4'. In order to apply the required over pressure p (=differential pressure over the pressure of the ambient atmosphere), e.g. at least 5 bar, dies 41, 42 may be used. However, any other method for pressing a semiconductor chip 1 individually or for pressing two or more semiconductor chips 1 simultaneously or successively against the top metallization layer 21 may also be used. Prior to, at the same time or after applying the over pressure p, the solder 4' is melted. In doing so, copper from the top metallization layer 21 and/or from metallizations of the semiconductor chips 1 diffuses into the fluid solder 4' and forms intermetallic copper-tin-phases like Cu6Sn5 and/or Cu3Sn. Then, the fluid solder 4' is cooled down to its solid state in which it forms a connection layer 4. As the intermetallic copper-tin-phases have a melting point of at least 415° C., the joint between the semiconductor chip 1 and the top metallization layer 21 is temperature-stable even if the semiconductor chips 1 are operated at high temperatures.

In case of a sintered joint to be formed between the semiconductor chips 1 and the top metallization 21, the connection material 4' may be a silver containing paste. The top metallization layer 21 and that side of the semiconductor chip 1 facing toward the metallization layer 21 may be coated with a noble metal, e.g. silver or gold, in order to facilitate the subsequent sintering process.

According to FIG. 12(B), the semiconductor chips 1 are pressed against the top metallization 21 such that the respective pressure p inter alia acts on the connection material 4'. In order to apply the required over pressure p (=differential pressure over the pressure of the ambient atmosphere), e.g. at least 20 bar, dies 41, 42 may be used. However, any other method for pressing a semiconductor chip 1 individually or for pressing two or more semiconductor chips 1 simultaneously or successively against the top metallization layer 21 may also be used. Prior to, at the same time or after applying the over pressure p, the connection material 4' is heated to a temperature of at least 220° C. Thereby, a sintered joint between the semiconductor chips 1 and the top metallization layer 21 is formed.

In any embodiment of the present invention, forming a sintered or diffusion soldered joint between a semiconductor chip 1 and a top metallization layer 21 of a substrate 2 as described with reference to FIGS. 12(A) and (B) may take place prior the step of forming an electrically conductive connection between the top metallization layer 21 and the first end 31 of one or more contact pins 3 as described above.

In any circuit carrier 2 of the present invention, the top metallization 21 may be, for instance, made of copper or comprise at least 90% by weight copper, or may be made of aluminum or comprise at least 90% by weight aluminum.

Independently from the material of the top metallization 21, the insulation carrier 20 may be a ceramic. For instance, the insulation carrier 20 may include or consist of one of the following materials: aluminum oxide ($Al_2O_3$); aluminum nitride (AlN); silicon nitride ($Si_3N_4$). The thickness d20 of the insulation carrier 20 may range, e.g., from 0.2 mm to 2 mm. In some embodiments, circuit carrier 2 may be a direct copper bonding substrate (DCB substrate), or a direct aluminum bonding substrate (DAB substrate), or an active metal brazing substrate (AMB substrate).

Further, independently of the materials used for the top metallization 21 and the insulation carrier 20, any contact pin 3 that can be used in the instant invention may be, for instance, made of copper or comprise at least 90% by weight copper, or may be made of aluminum or comprise at least 90% by weight aluminum.

Inter alia, the present invention allows for the use of straight pins that are placed at any arbitrary location on the substrate 2, that is, along the borders of the substrate 2 as well as spaced distant from the borders. Two, more or all contact pins of the semiconductor module may have identical shape. For instance, each single contact pin 3 may have an ampacity at least 50 A. For redundancy reasons and/or for switching currents higher than 50 A, two or more contact pins 3 may be connected in parallel. This can be done by welding two or more contact pins 3 to the same section of the top metallization layer 21 so that that section electrically connects the respective contact pins 3.

The small area required on the top metallization layer and a joining process that is compatible with the new assembly process to place contact pins 3 anywhere on the substrate 2 even between semiconductor chips 1 helps to save wiring area on the substrate 2 because the input or output may be led out of the module housing 6 perpendicularly above the first end 31 which is directly welded to the required location on the metallization layer. Thus, unnecessary conductive lines formed of the top metallization layer 21 can be avoided. In particular, no conductor paths need to run from the central area of the top metallization toward the outer edges of the substrate 2.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for producing a power semiconductor arrangement, comprising:
    providing a dielectric insulation carrier having a plane top side and a top metallization layer arranged on the plane top side;
    providing a semiconductor chip;
    joining the semiconductor chip and the top metallization layer by a connection layer between the semiconductor chip and the top metallization layer, the connection layer being produced by diffusion soldering or by sintering;
    providing a number N≥1 of electrically conductive contact pins each comprising a first end; and
    forming, for each of the contact pins, an electrically conductive connection between the top metallization layer and the first end, in which electrically conductive connection material of the contact pin is in direct physical contact with a material of the top metallization layer.

2. The method as claimed in claim 1, wherein the top side metallization has one or both of:
    a thickness of at least 100 µm;
    a thickness of less than or equal to 2 mm.

3. The method as claimed in claim 1, wherein the electrically conductive connection between one, more or all of the contact pins and the top metallization layer is a welded connection.

4. The method as claimed in claim 1, wherein the electrically conductive connection between one, more or all of the contact pins and the top metallization layer is produced by one of:
    laser or electron beam welding;
    resistance welding;
    spin welding;
    friction welding;
    linear or torsional ultrasonic welding; and
    ball bonding.

5. The method as claimed in claim 1, wherein the first end of one, more or all of the contact pins and the top metallization layer is formed as a flange.

6. The method as claimed in claim 1, wherein one, more or all of the contact pins comprises a shaft having a rectangular or circular outer circumference.

7. The method as claimed in claim 1, wherein one, more or all of the contact pins comprises a solid shaft.

8. The method as claimed in claim 1, wherein one, more or all of the contact pins comprises a hollow shaft.

9. The method as claimed in claim 8, wherein:
    one, more or all of the contact pins comprises, at the respective second end, an opening; and
    a welded connection between the respective contact pin and the top metallization layer is produced by a beam welding method, wherein a welding beam enters the opening and runs through the hollow shaft as far as the first end.

10. The method as claimed in claim 9, wherein the hollow shaft of the respective contact pin comprises a first pin hole spaced distant from both the first and second ends and which defines a narrow passage inside the hollow shaft.

11. The method as claimed in claim 1, wherein the second end of one, more or all of the contact pins is formed as one of:
    a forked end;
    a mechanical compensating element;
    a straight end; and
    a male or female press-fit connector.

12. The method as claimed in claim 1, wherein the welded connection between one, more or all of the contact pins and the top metallization layer is at least one of:
    solder-free;
    adherent-free; and
    free of a sintered connection layer.

13. The method as claimed in claim 1, wherein one, more or all of the contact pin is made of copper, or comprises at least 90% by weight copper, or is made of aluminum, or comprises at least 90% by weight aluminum.

14. The method as claimed in claim 1, wherein the top side metallization is made of copper, or comprises at least 90% by weight copper, or is made of aluminum, or comprises at least 90% by weight aluminum.

15. The method as claimed in claim 1, wherein the insulation carrier is made of a ceramic material.

16. The method as claimed in claim 1, wherein, after forming the electrically conductive connection between the top metallization layer and the first end of one, more or all of the contact pins, a difference between a thickness of the top metallization and a distance between the respective contact pin and the top side is less than 0.1 mm.

17. The method as claimed in claim 1, wherein a distance between at least one of the contact pins and the semiconductor chip is less than or equal to 0.7 mm.

18. The method as claimed in claim 1, wherein a distance between at least one of the contact pins and a lateral edge the semiconductor chip is less than or equal to 0.7 mm.

19. The method as claimed in claim 1, wherein $N \geq 2$ and welded connections between the first ends and the top metallization layer are formed.

20. The method as claimed in claim 19, wherein at least two of the contact pins are arranged at a repeat distance which is less than or equal to 0.7 mm.

21. A method for producing a power semiconductor arrangement, in which a number of $N \geq 2$ or of $N \geq 10$ contact pins are subsequently connected to a top metallization layer of a circuit carrier, the method comprising:
   (a) providing a semiconductor chip;
   (b) joining the semiconductor chip and the top metallization layer by a connection layer arranged between the semiconductor chip and the top metallization layer, the connection layer being produced by diffusion soldering or by sintering;
   (c) providing a dielectric insulation carrier with a top side and a top metallization layer arranged on the top side;
   (d) providing a contact pin reservoir capable of providing a number of contact pins, each of the contact pins having a first end and an opposite second end; and
   (e) forming, for each of a number of contact pins of the contact pin reservoir, an electrically conductive connection between the top metallization layer and the first end of the respective contact pin, in which electrically conductive connection material of the contact pin is in direct physical contact with a material of the top metallization layer.

22. The method as claimed in claim 21, wherein the contact pin reservoir is a continuous contact pin wire on a roll, the contact pin wire having a first end, the method comprising:
   (f) forming an electrically conductive welded or ball bonded connection between the first end of the contact pin wire and the top metallization layer;
   (g) cutting off a piece of the contact pin wire so as to achieve a new first end of the contact pin wire; and
   (h) repeating steps (f) and (g) at least once.

23. The method as claimed in claim 21 wherein the contact pin reservoir is a magazine with a number of contact pins each having a first end inserted, the method comprising subsequently forming electrically conductive welded or ball bonded connections between the first ends and the top metallization layer.

24. The method as claimed in claim 21, wherein, for each of the number of contact pins, after forming the electrically conductive connection between the top metallization layer and the first end of the respective contact pin, a difference between a thickness of the top metallization layer and a distance between the respective contact pin and the top side is less than 0.1 mm.

25. The method as claimed in claim 21, comprising mounting the semiconductor chip onto the top metallization layer prior to or after forming the electrically conductive connections between the first ends of the number of contact pins and the top metallization layer.

* * * * *